United States Patent [19]

Chatterjee et al.

[11] 4,268,950
[45] May 26, 1981

[54] POST-METAL ION IMPLANT PROGRAMMABLE MOS READ ONLY MEMORY

[75] Inventors: Pallab K. Chatterjee, Dallas; Al F. Tasch, Jr., Richardson, both of Tex.

[73] Assignee: Texas Instruments Incorporated, Dallas, Tex.

[21] Appl. No.: 912,774

[22] Filed: Jun. 5, 1978

[51] Int. Cl.³ .............................................. B01J 17/00
[52] U.S. Cl. .................................... 29/571; 29/576 B; 29/577 R; 29/578; 29/584; 148/1.5; 357/45; 357/91
[58] Field of Search ................. 29/571, 577, 578, 584, 29/576 B, 590; 148/1.5; 357/45, 91

[56] References Cited
U.S. PATENT DOCUMENTS

| | | | |
|---|---|---|---|
| 3,747,203 | 7/1973 | Shannon | 29/578 |
| 3,865,651 | 2/1975 | Arita | 29/571 |
| 3,887,994 | 6/1975 | Ku | 29/584 |
| 3,914,855 | 10/1975 | Cheney | 29/577 |
| 4,129,936 | 12/1978 | Takei . | |

Primary Examiner—W. C. Tupman
Attorney, Agent, or Firm—William E. Hiller; Melvin Sharp; James T. Comfort

[57] ABSTRACT

An MOS read only memory, or ROM, is formed by a process compatible with standard silicon gate manufacturing methods. The ROM is programmed either after the top level of device interconnects has been patterned and sintered, usually the last step in the slice processing method before electrical testing of the devices, or after the electrical testing of the devices. All potential MOS transistors in the ROM array are initially at a logic "0" or a logic "1". Selected transistors are programmed by implanting ions of the appropriate impurity type through their gates and gate oxides into the silicon, using photoresist as an implant mask. Impurities are electrically activated by laser annealing, and residual oxide charge is removed by rf plasma anneal.

10 Claims, 15 Drawing Figures

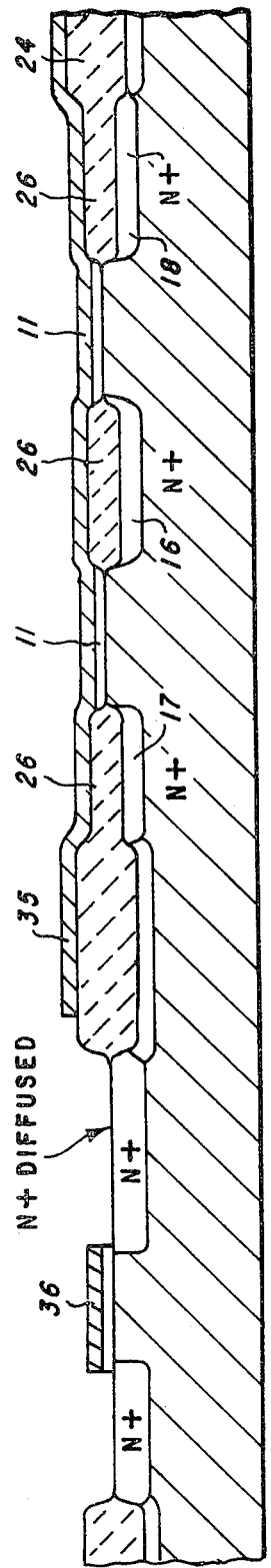
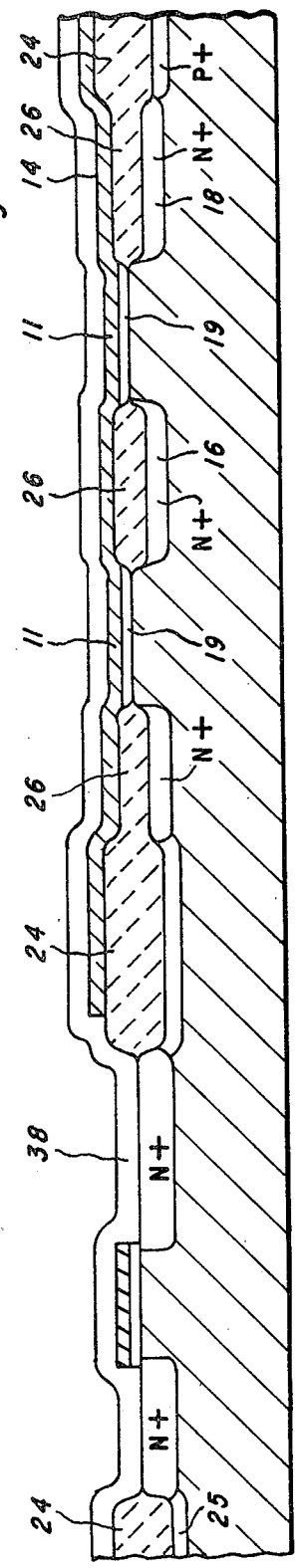
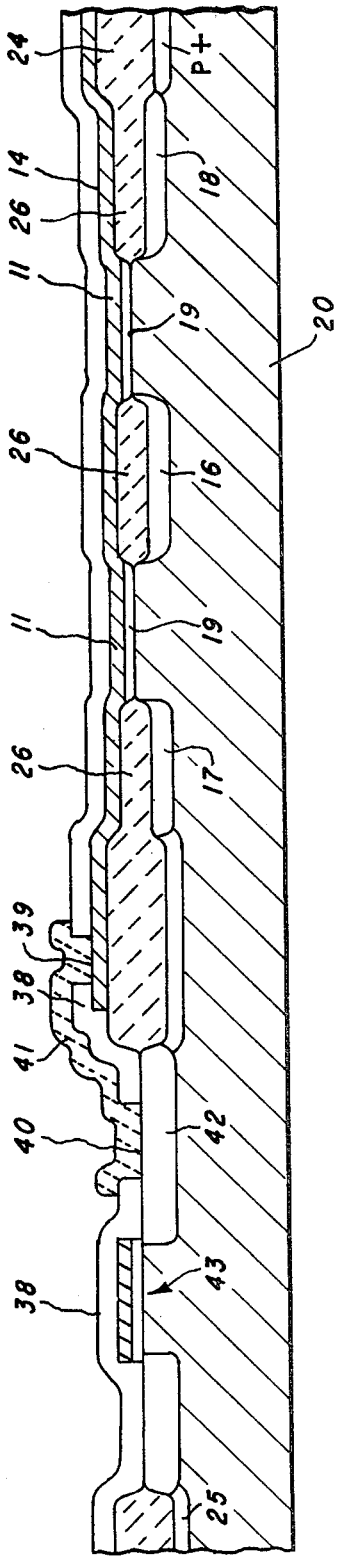

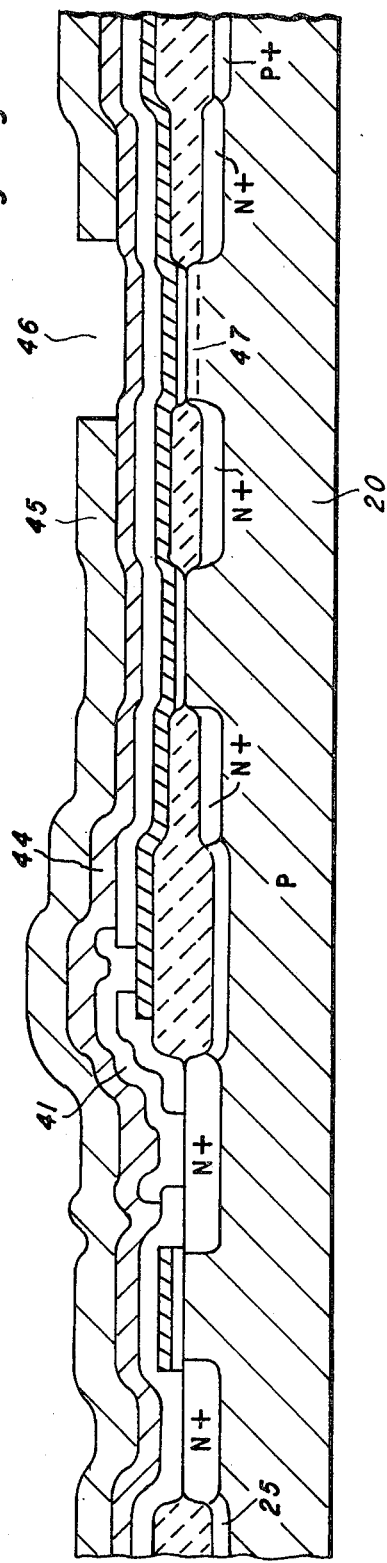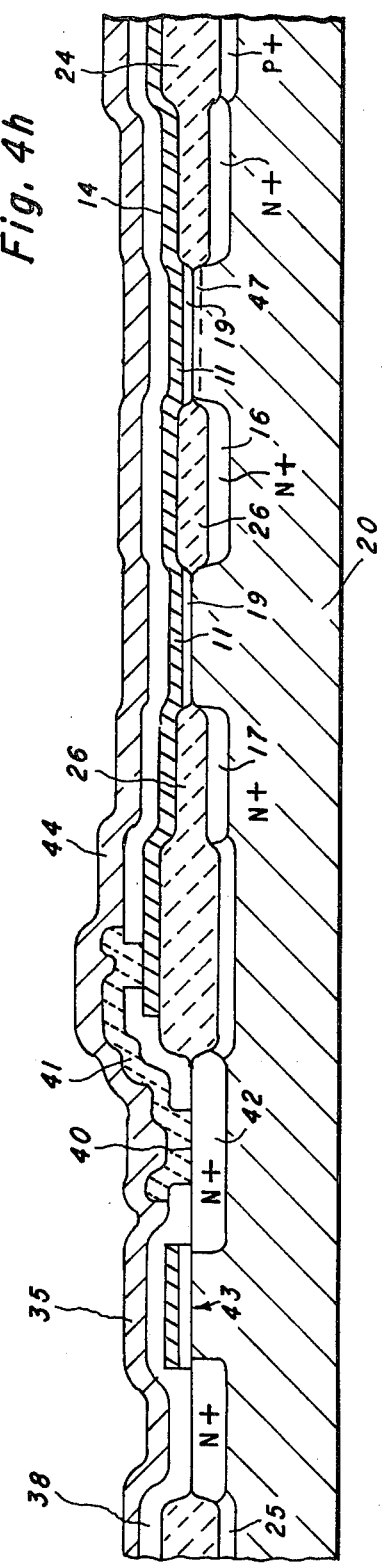

POST-METAL ION IMPLANT PROGRAMMABLE MOS READ ONLY MEMORY

BACKGROUND OF THE INVENTION

This invention relates to semiconductor memory devices, and more particularly to an N-channel silicon gate MOS read only memory and a process for making it.

Semiconductor memory devices are widely used in the manufacture of digital equipment such as minicomputers and microprocessor systems. Storage of fixed programs is usually provided in these systems by MOS read only memory devices or "ROMS". ROMs are made by semiconductor manfuacturers on special order, the programming code being specified by the customer. The manufacturing process is lengthy, requiring dozens of steps, each taking up time and introducing materials handling and inventory factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. metal gate ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 762,612, filed Jan. 29, 1977 and Ser. No. 701,932, filed July 1, 1976, assigned to Texas Instruments. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip and more recently post-metal programmable ROM's have been disclosed in pending applications, Ser. No. 890,555, by C. K. Kuo, Ser. No. 912,635, filed June 5, 1978 by Chatterjee and Tasch, and Ser. No. 912,775, filed June 5, 1978 by Chatterjee and Tasch, all assigned to Texas Instruments.

It is the principal object of this invention to provide a semiconductor permanent store memory cell of small size which may be programmed at a late stage in the manufacturing process. Another object is to provide a small-area MOS ROM cell which is made by a process compatible with standard N-channel silicon gate manufacturing techniques and is programmable after the metal interconnections have been applied and patterned.

SUMMARY OF THE INVENTION

In accordance with an embodiment of the invention, a metal-oxide-semiconductor read only memory, or MOS ROM, is formed in an integrated circuit along with other silicon gate transistors for the peripheral circuitry. The ROM is an array of potential MOS transistors where polysilicon strips on a silicon bar define the address lines and gates, and output and ground lines are defined by elongated N+ regions. In the array, selected transistors are programmed by implanting boron ions through the protective nitride, through the polysilicon address line which forms the gate, and through the gate oxide into the silicon beneath the gate oxide, photoresist being used as an implant mask. The implanted impurities are activated by laser annealing, and residual oxide charge caused by the implant is removed by an rf plasma anneal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a–4h are elevation views in section of the ROM array and a transistor in the peripheral part of the semiconductor device of FIGS. 1 and 3a–3d, at successive stages in the manufacturing proces, taken generally along the line a—a in FIG. 1.

DETAILED DESCRIPTION OF SPECIFIC EMBODIMENTS

Figure 1:
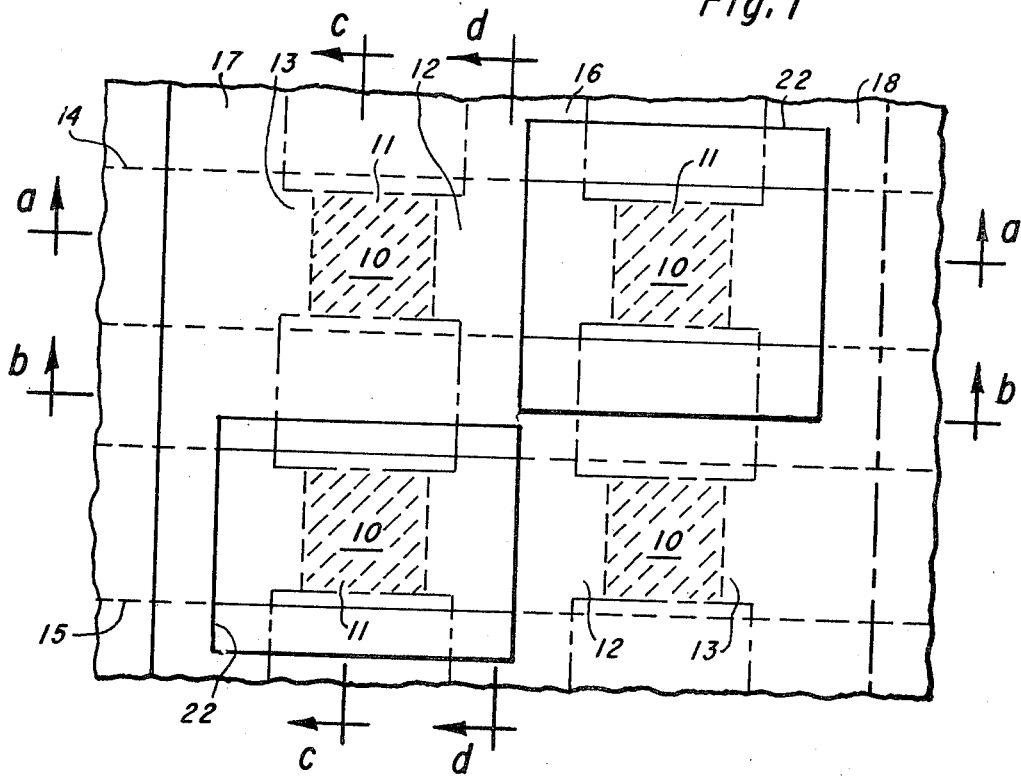
FIG. 1 is a greatly enlarged plan view of a small portion of a semiconductor chip showing the physical layout of a part of a ROM array made according to the invention.
Figure 2:
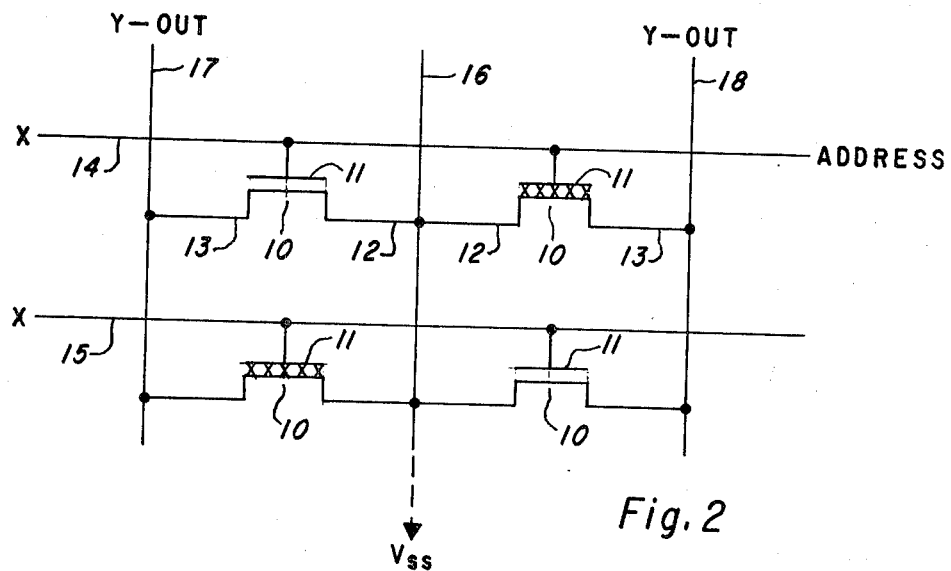
FIG. 2 is an electrical schematic diagram of the ROM of FIG. 1.
Figure 3A:
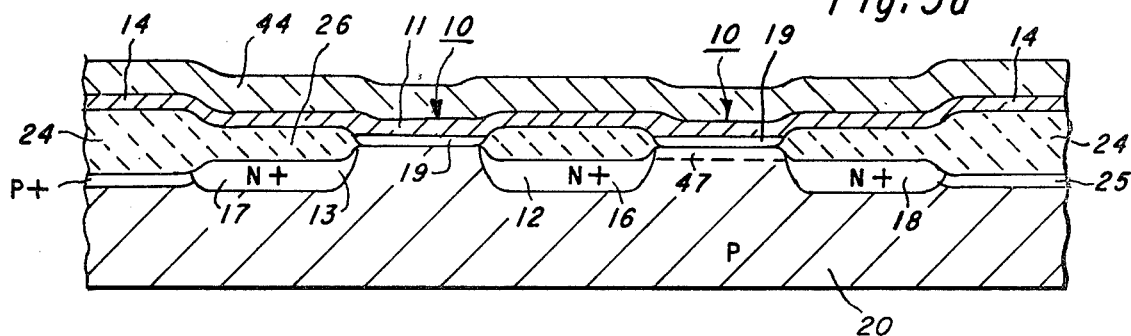
FIGS. 3a–3d are elevation views in section of the cell of FIG. 1, taken along the lines a—a, b—b, c—c, and d—d, respectively.
Figure 3B:
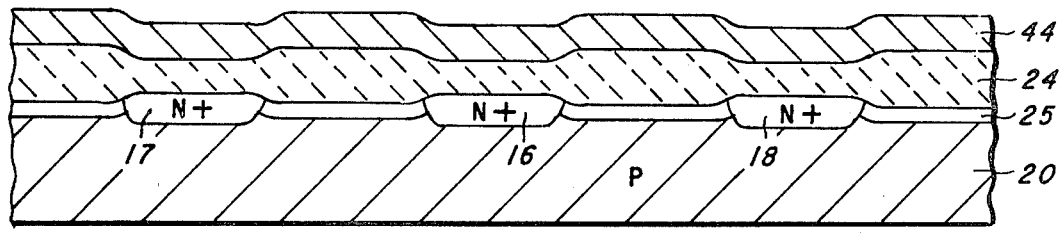
Figure 3C:
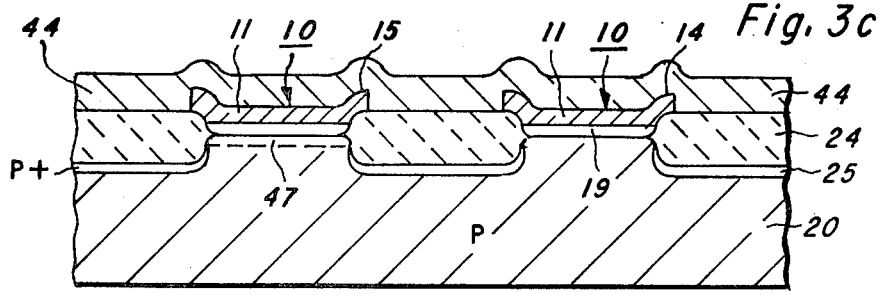
Figure 3D:
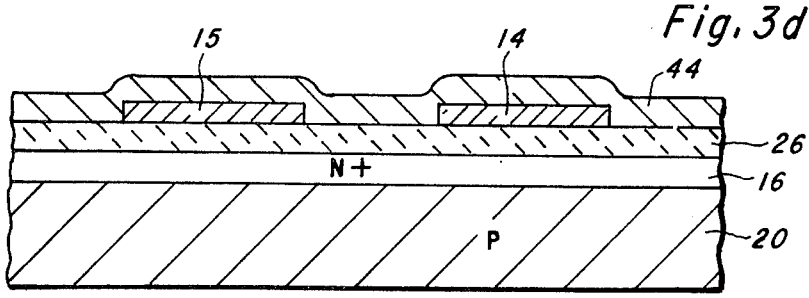

With reference to FIGS. 1, 2, and 3a–3d, a read only memory is illustrated which is programmed according to the invention. The array consists of a large number of cells 10, only four of which are shown. Each cell is an MOS transistor having a gate 11, a source 12 and a drain 13. The gates 11 are parts of polysilicon strips 14 and 15 which are the X address lines for the array. The sources are part of an N+ diffused region 16 which is connected to ground or Vss, while the drains are part of N+ diffused regions 17 and 18 which are Y output lines. The array, formed on a silicon bar 20, would typically contain perhaps 64K or 128K cells, so the bar would be about 200 mils on a side or 40,000 sq. mil area. The four cells 10 shown would be on a minute part of the bar, perhaps two mils wide. A 64K ROM would require 256 X lines such as 14 and 15 and 256 Y lines like the lines 17 and 18 providing 65,536 bits. Although one Vss line 16 is shown for two Y lines, the array could be of the virtual ground type as disclosed in U.S. Pat. No. 3,934,233, issued to Roger J. Fisher and Gerald D. Rogers or U.S. Pat. No. 4,021,781 issued to Edward R. Caudel both assigned to Texas Instruments, in which case one Vss line for each eight or sixteen Y lines would be all that would be needed.

The cell array is programmed by boron implant through the protective nitride 44, the polycrystalline silicon strips 14 and 15 and the gate oxide 19 to raise the threshold voltage of selected ones of the cells 10 to a value above that which will be turned on by the voltage on the selected address line 14, 15, etc. In the example of four cells shown, the upper right cell and the lower left cell are implanted in this manner, the others are not. A thick photoresist layer 45 is used as the implant mask, with aperatures 46 above the cells 10 which are to be implanted. The ion implant creates implanted regions 47 in the channel areas of the selected transistors 10. The regions 47 are doped more heavily P-type than the original silicon substrate 20.

A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17, 18. No metal lines are used in the cell array, only in the peripheral areas.

Turning now to FIGS. 4a-4g, a process for making the ROM array of the invention will be described. The right hand side of these FIGURES corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the —100— plane, of a resistivity of about 6 to 8 ohm-cm. As above, in the FIGURES the portion shown of the bar 20 represents only a very small part of the slice, perhaps 1 or 2 mils wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 19, but usually the layer is later removed and new gate oxide grown. Next, a layer 32 of silicon nitride of about 1000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
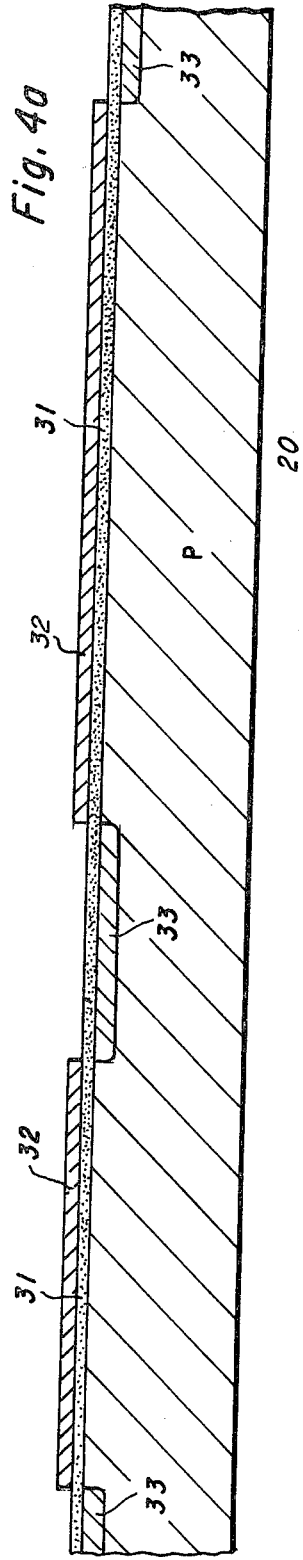
Figure 4B:
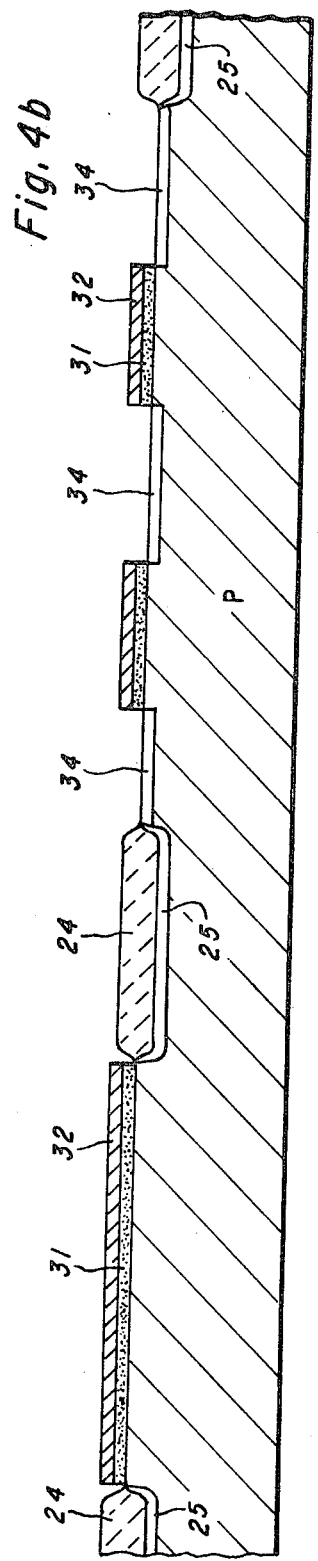

The next step in the process is formation of field oxide 24, which is done by subjecting the slices to steam or an oxidizing atmosphere at about 900 degrees C. for perhaps five hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the slice is again subjected to a nitride etchant which removes the parts of the nitride layer 32 now exposed by holes in the photoresist. The parts of the oxide layer 31 exposed when this nitride is removed are then etched to expose bare silicon. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Figure 4C:
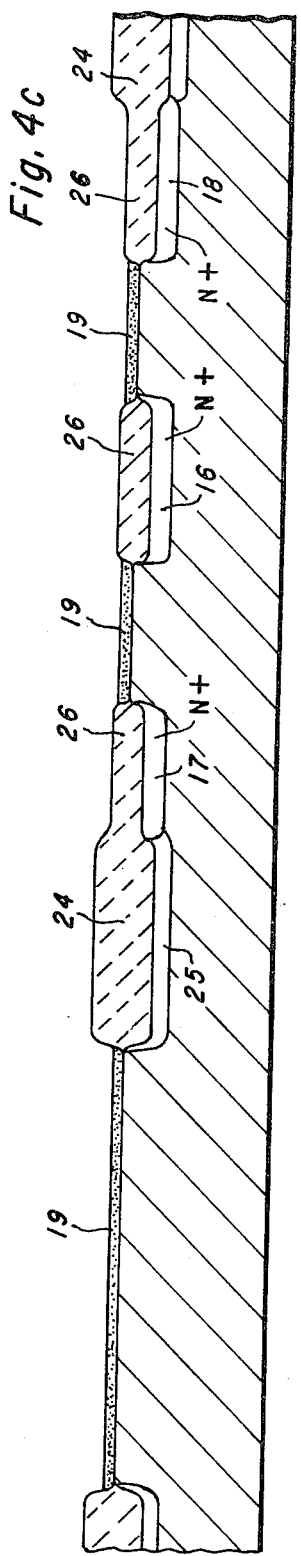

Referring to FIG. 4c, a second field oxidation step is now performed by placing the slice in steam or dry oxygen at about 1000 degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 33 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide, then the oxide 31 is removed by etching and the exposed silicon cleaned. The gate oxide 19 is grown by thermal oxidation to a thickness of about 1000 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed, are patterned and etched at this point using photoresist; none are needed in the ROM array itself or the peripheral transistor shown.

As seen in FIG. 4d a layer 35 of polycrystalline silicon is deposited over the entire slice in a reactor using standard techniques. This layer is doped with phosphorous by the later N+ diffusion to make it highly conductive. The polysilicon layer 39 is patterned by applying a layer of photoresist, exposing to ultraviolet light through a mask prepared for this purpose, developing, then etching both photoresist and exposed oxide. The remaining photoresist masks certain areas of the polysilicon to define the lines 14 and 15, and the gates of peripheral transistors, connections to contacts and other such parts of the circuit on the chip. The unmasked polycrystalline silicon is etched away, so the resulting structure seen in FIG. 4d includes a part of the remaining polysilicon layer 35 which provides what will be a gate 36 of an N-channel MOS transistor, the gates 11 in the ROM array, as well as the line 14. The thin oxide 19 underneath the gate 36 is the gate oxide of the transistor. These polysilicon and oxide layers also provide gate and gate oxide for all the other transistors in the ROM array, and gate and gate oxide for other peripheral transistors on the slice.

As will be seen in FIG. 4e, a thick layer 38 of silicon oxide is now deposited by decomposition of silane at a low temperature, about 400 degrees C. This layer 38 insulates the metal level from the polycrystalline silicon level of interconnections, and is referred to as multilevel oxide.

Referring to FIG. 4f, the multilevel oxide layer 38 is now patterned by a photoresist operation, exposing the entire ROM array area, as well as a contact area 39 for a metal-to-polysilicon contact and a contact area 40 for a metal-to-silicon contact. These are of course merely illustrative; metal contacts and interconnections are used in the periphery of the chip in the input buffers, decoders, sense amplifiers, substrate pump, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves a metal strip 41 connecting the source 42 of N-channel silicon gate transistor 43 to the contact area 39 at one end of the polysilicon X address line 14 as seen in FIG. 4f.

The last stage of the normal fabrication process is the definition and patterning of the protective nitride layer. A layer 44 of silicon nitride of about 3000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the openings over the bonding pads. Upon developing, unexposed photoresist is removed from areas above the bonding pads. The slice is then placed in an rf plasma reactor which removes the nitride which is not covered by photoresist, but does not remove the photoresist or attack the aluminum. The photoresist is then removed. As previously mentioned this step terminates the normal slice fabrication process.

Up to this point in the process all slices are exactly the same as no programming has been done in the ROM array. The slices are processed routinely to this stage with no requirement for separate inventory controls and separate identification of each lot. An inventory of slices finished up through metal patterning may be maintained for quick response to custom orders for ROM codes.

In accordance with the primary feature of the invention, the ROM array is programmed by first coating the entire slice with a layer 45 of photoresist and exposing it to ultraviolet light through a mask which defines the ROM code. Upon developing, the unexposed photoresist is removed leaving apertures 46 in the resist over each cell 10 to be programmed as a "0", and leaving resist over each cell 10 to be a "1". The slice is then subjected to a boron implant at about 500 KeV to a dose of about $1 \times 10^{13}$ per sq. cm., leaving the slice as shown in FIG. 4g. The energy level and dose depend on the thickness of the protective nitride, polysilicon gate, gate oxide as well as the desired change in the threshold voltage. At this level, the ion implant penetrates the protective nitride 44, the polycrystalline silicon gate 11 and gate oxide 19 to create an implanted region 47 in the channel area. The photoresist mask is then removed and the slice is subjected to a laser anneal of the type described in Applied Physics Letters, Mar. 1, 1978 at pp. 276-278. This annealing electrically activates approximately 90% of the implanted boron and may be performed with the slice at room temperature. The last step involves the use of an rf plasma anneal of the type described in International Electron Device Meeting Technical Digest, 1977 at pp. 151-153. The rf anneal removes any positive charge induced at the oxide-silicon interface due to the implant. This implant raises the threshold voltage above about 5 v. Since the part operates on a supply voltage Vdd of 5 v., the full logic 1 level will not turn on the transistor. The transistors covered by the oxide 21 will not be implanted so will retain the usual threshold voltage of about 0.8 v. It is important that the mask alignment for creating the apertures 46 for the programming mask is non-critical. The active channel area to be implanted has already been defined in previous processing step with thin gate oxide 19.

In operation, the X address selects one of the lines 14 or 15, or one of the other of the 256 such lines in a 64K ROM, and this selected line is held at logic 1 level or about +5 v. The remaining lines are held at Vss, logic 0. The Y address selects one of the 256 lines such as 17 and 18, and this line is connected via the Y decoder to the output. The Y lines usually would be precharged prior to an access cycle, so the selected line will conditionally discharge depending upon whether the selected bit at the intersection of the addressed X and Y lines is programmed a 1 or a 0.

The purpose of the ion implant for programming the cell array is to change the threshold voltage of some of the transistors 10 relative to the others, depending upon whether a "1" or a "0" is to be stored. A ROM cell can be either normally on or normally off when selected. The feature of this invention can be used in either P-channel or N-channel ROMs, so, depending on channel type and whether the cells are to be normally on or normally off when selected, the proper type of dopant for ion implant is determined. In the embodiment described in detail above, a boron implant is used to increase the threshold voltage such that a transistor 10 is off when selected. The normally on device can be either enhancement or depletion mode. In another example, such as the series ROM of U.S. Pat. No. 4,059,826 mentioned above, the ion implant would lower the threshold to depletion mode.

While this invention has been described with reference to an illustrative embodiment, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a read-only-memory comprising the steps of:

forming a plurality of insulated gate field effect transistors in a face of a semiconductor body, each of said transistors having a source, a drain and a gate, said transistors being in a regular pattern to provide an array of memory cells; and programming the array of memory cells by masked ion implant through the gate and gate insulator into said semiconductor body beneath selected ones of said transistors, laser annealing to activate said implanted ions, and r.f. annealing to eliminate implant induced interface charge.

2. A method according to claim 1 wherein a plurality of other transistors and a plurality of contacts and interconnections are formed on said face peripheral to said array, wherein said step of programming uses a mask comprising a coating of photoresist applied after said contacts and interconnections have been formed.

3. A method according to claim 2, wherein the said field effect transistors and said other transistors are n-channel silicon gate transistors, and wherein said contacts and interconnections are formed by metal deposited in a thin film and patterned.

4. A method of making a semiconductor device comprising the steps of:
forming a plurality of circuit elements in a face of a semiconductor body, each of said circuit elements having electrodes in said face and a control electrode overlying said face; and changing the characteristics of the circuit elements by masked ion implant through the control electrode into the semiconductor body beneath, laser annealing to activate the implanted impurity, and r.f. annealing to eliminate implant induced interface charge.

5. A method according to claim 3 wherein said ions are p-type.

6. A method according to claim 3 wherein said metal is aluminum.

7. A method according to claim 1 wherein said implant penetrates through an insulating layer overlying said gate.

8. A method according to claim 4, wherein a plurality of contacts and interconnections are formed on said face, and wherein said step of changing uses a mask comprising a coating of photoresist applied after said contacts and interconnections have been formed.

9. A method according to claim 8, wherein said circuit elements are field effect transistors.

10. A method according to claim 4 wherein said implant penetrates through an insulating layer overlying said control electrode.

* * * * *